United States Patent [19]

Stansfield

[11] Patent Number: 5,408,434
[45] Date of Patent: Apr. 18, 1995

[54] MEMORY DEVICE THAT FUNCTIONS AS A CONTENT ADDRESSABLE MEMORY OR A RANDOM ACCESS MEMORY

[75] Inventor: Anthony I. Stansfield, Bristol, United Kingdom

[73] Assignees: Inmos Limited, Bristol; Chancellor, Masters and Scholars of the University of Oxford, Oxford, both of England

[21] Appl. No.: 190,912

[22] Filed: Feb. 3, 1994

[30] Foreign Application Priority Data

Feb. 16, 1993 [GB] United Kingdom ............. 9303084

[51] Int. Cl.6 .................................................. G11C 8/00
[52] U.S. Cl. .................................. 365/189.08; 326/44
[58] Field of Search ........................... 307/465, 465.1; 365/189.08

[56] References Cited

U.S. PATENT DOCUMENTS

| 4,646,271 | 2/1987 | Uchiyama et al. | 365/49 |
| 5,051,949 | 9/1991 | Young. | |
| 5,282,163 | 1/1994 | Schibata | 365/189.08 |
| 5,299,147 | 3/1994 | Holst | 365/49 |

FOREIGN PATENT DOCUMENTS 1-125124  5/1989  Japan.

*Primary Examiner*—Edward P. Westin
*Assistant Examiner*—Stephen Calogero
*Attorney, Agent, or Firm*—Felsman, Bradley, Gunter & Dillon

[57] ABSTRACT

A programmable logic device is disclosed which can be used either as a look-up table logic device or as a logic function generator. This enables combinations to be provided such as the combination of a look-up table with a fixed gate field programmable gate array.

6 Claims, 8 Drawing Sheets

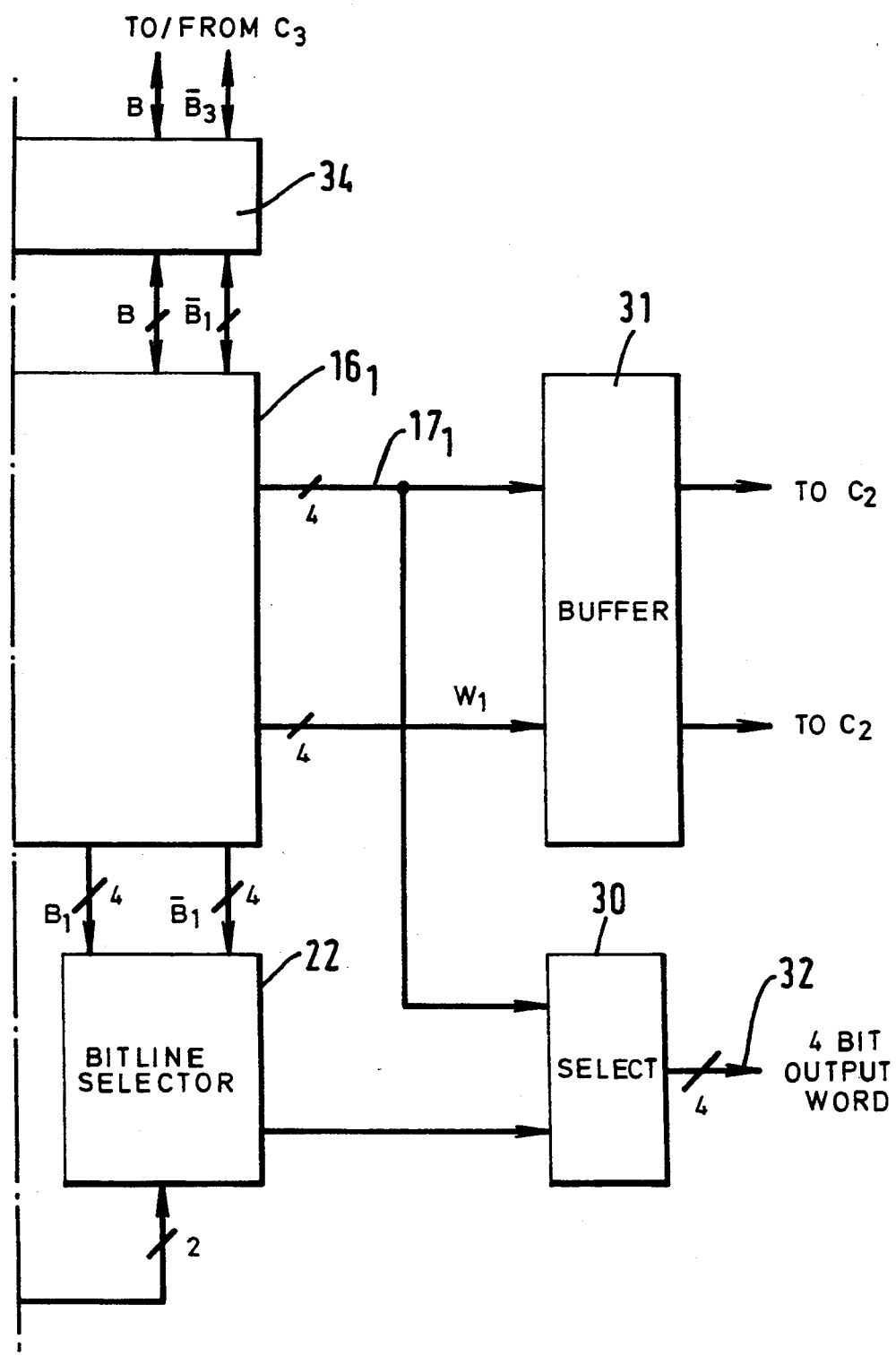
FIG. 3 (Contd.)

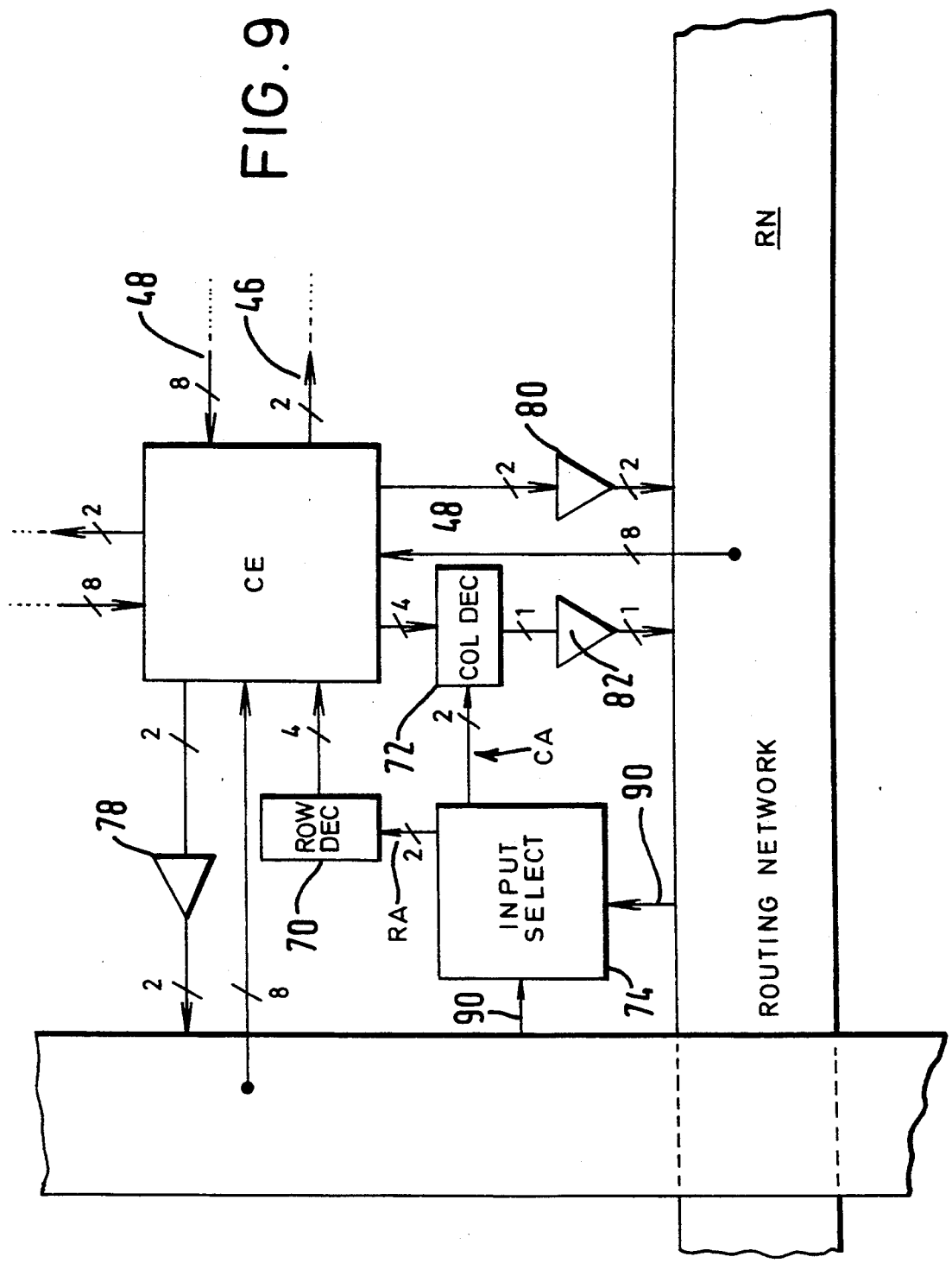

MEMORY DEVICE THAT FUNCTIONS AS A CONTENT ADDRESSABLE MEMORY OR A RANDOM ACCESS MEMORY

FIELD OF THE INVENTION

The present invention relates to a programmable logic circuit, and particularly to such a circuit which can be used to implement a programmable logic device.

BACKGROUND TO THE INVENTION

Programmable logic devices (PLD) are logic devices which can be programmed by a user to perform a specific logic function. They generally consist of a plurality of logic function generators which are connected one to another by an interconnection network. Programmable logic devices are known in which both the function generators and the interconnection network can be programmed. The logic function generator is commonly referred to as a unit cell, the programmable logic device (PLD) being a regular array of said unit cells. A number of such unit cells are known, those in common usage being discussed below. Field Programmable Gate Array (FPGA) is a generic term commonly used in the art for large capacity PLDs.

1) Fixed Gates

The unit cell is a logic gate having a fixed logic function, often a NAND gate in a CMOS device. It is known to construct an array of such gates with a programmable interconnection network, although the logic function of each unit is fixed. The programmability of the interconnection network arises by the provision of a multiplexer on the inputs of each NAND gate so that the inputs to each NAND gate can come from any of a number of different unit cells within the interconnection network. The array can then be programmed by setting a state of all of the multiplexers in the array, so that signals are correctly routed through the array.

2) Programmable Logic Arrays (PLA)

These arrays comprise a plurality of rows of switches, each row providing an output which is a logical OR of some of a plurality of inputs to the switches in that row. Each row is arranged to receive a set of inputs and their inverses. The logic function to be implemented by the array is set by setting the state of the switches. The same structure can also be used to generate a logical AND function. It is known to use a programmable logic array to provide outputs which are used as the inputs to a second such array, and these are often referred to as AND plane/OR plane structures.

3) Look-Up Tables (LUT)

The basic unit cell for a look-up table is a small random access memory comprising a plurality of memory cells. Inputs to the memory provide the address for the memory, and the output is the data read from the cell at the addressed memory location. By storing appropriate data in the memory, it is possible to generate any Boolean function of a number of variables up to the address width of the memory.

The fixed gate array, the PLA switch and the LUT cell are all programmed by storing data according to the logic function to be implemented. In the PLA, this data controls the state of the switches of the PLA; in the LUT, this data is stored in the memory cell; and in the fixed gate array the data controls the routing connections of the multiplexers.

The various types of programmable logic devices set out above have different characteristics so that they are preferred for certain logic manipulations and less preferred for others.

The following table gives a general guide as to the good points and bad points of each type of programmable logic device.

| Cell type | Good at: | Bad at: |
| --- | --- | --- |
| Fixed Gate | Logic which uses the same gate as the basic cell | Logic using other gates |
| PAL/PLA | 1) multiple input AND and OR gates (such as decoders) 2) AND-plane/OR-plane (sum of products) designs | Complex functions of few inputs (e.g. exclusive OR) Hence Adders, parity generators etc. are hard |
| Lookup Table | Can implement any function of its inputs. Hence adders, simple parity etc. are easy. | Gates with many more inputs than the unit cell (big comparators, decoders etc.) |

Thus, a user who has selected a particular programmable logic device based on his preferred implementation will find that he does not have the versatility to use that logic device to optimum effect in different logic applications. The present invention seeks to provide a programmable logic device which is more versatile.

SUMMARY OF THE INVENTION

According to one aspect of the present invention there is provided a programmable logic device comprising:

a plurality of logic elements and connected to each logic element a switch circuit the state of which is controllable to determine connections between the logic elements;

a storage circuit providing at least one storage location and operatively connected to the switch circuit;

addressing circuitry operatively connected to a plurality of said storage locations whereby a selected one of said storage locations can be addressed, wherein each storage location can be programmed to hold in mode (a) routing data defining the state of its associated switch circuit or in mode (b) logic data representing the result of a logic function and which is output from a selectively addressed storage location; and programming circuitry operable to determine whether the storage circuits implement mode (a) or mode (b).

Preferably the programming circuitry is operable by a user.

The unit cell in a device of this type is determined by the number of storage locations in the plurality addressable as a common block by the addressing circuitry.

Thus, in its broadest aspect, the present invention seeks to provide an array of unit cells in which each unit cell can be used either as a look-up table logic device by using the addressing circuitry to address the storage locations defining the look-up table or as a logic function generator whose function is determined by the stored routing data.

One possible combination is a combination of a look-up table with a fixed gate field programmable gate array. In this combination, each logic element can implement a fixed logic function, such as an AND gate having a plurality of inputs. The logic elements can be interconnected via the switch circuits which can be connected to supply as inputs to some of the logic elements, outputs of others of the logic elements. The storage locations can then be used to store data for controlling the switch circuits, which can take the form of multiplexers.

In another combination, the function of the look-up table can be combined with a programmable logic array in which the logic elements are each selectively connectable to an output line via said switch circuits the state of which can be set in response to stored routing data. This particular combination has particularly useful attributes as set out further herein. It has been found in particular that it is possible to implement a programmable logic device in which one memory cell is capable of implementing the function of the storage location and also the function of the logic element and switch circuit.

Thus, according to another aspect of the present invention there is provided a programmable logic device comprising a plurality of logic circuits interconnected through an interconnection network, each logic circuit comprising: an array of memory cells, each memory cell being (a) responsive to an address signal at the location of that cell to output data stored in the cell, and (b) operable to compare data input to it with data stored in it and to output a match signal when said input data matches said stored data;

first circuitry for operating said array as a random access memory (RAM) with the cells in mode a);

second circuitry for operating said array as a content addressable memory (CAM) with the cells in mode b); and a mode select circuit operable to selectively control operation of the cell as CAM or RAM, the logic device further comprising programming circuitry arranged to control the state of the mode select circuits.

The mode select circuit can be arranged to route a sequence of data bits input to the cell selectively to one of said first and second circuits. Alternatively the mode select circuit can be arranged to select a particular output being the CAM or RAM output as desired.

Preferably, the array of memory cells comprises: a plurality of word lines, each word line being connected to a plurality of cells arranged in a row; a plurality of match lines, each match line being arranged to be driven by said plurality of cells in the row; a plurality of data lines, each data line being connected to a plurality of cells arranged in a column; and a plurality of sets of bit lines, each set of bit lines being associated with a plurality of cells arranged in a column. The array can be implemented using known CAM cells. An array of CAM cells can be used as a random access memory, with address bits supplied to the array selecting a particular word line and a particular set of bit lines so that a data bit is read from the thereby accessed memory location. Thus the array of memory cells can be programmed to act as a look-up table. The CAM array can also implement an associative function, where a sequence of bits placed onto the data lines is compared with the sequence of bits stored in a row of the CAM cells, a signal on the match line associated with the row which contains a sequence of data bits matching the input sequence of data bits indicating a match output. Thus, the array of memory cells can operate as a PAL array with each row corresponding to one PAL line.

Where both the match output and bit line output are available, the mode select circuit can determine which of these is used on the output of the logic circuit.

As described, separate data lines and bit lines are provided for each column of cells, selectable depending on whether the RAM or CAM function is be to implemented. In an alternative embodiment, the function of the data line and set of bit lines for each column can be combined into a single set of lines whose connections can be controlled to enable them to perform a data line or bit line function.

The first circuitry can comprise address circuitry for addressing a particular word line of the array and sense circuitry for sensing the data on a particular bit line of the array. Thus, when the mode select circuitry is operable to route a sequence of data bits input to the cell to the first circuitry, a first set of said input data bits is supplied to the address circuitry and a second set of said data bits is supplied to the sense circuitry.

When the mode select circuitry is operable to route the sequence of input data bits to the second circuitry, the data bits are placed directly onto the data lines of the cell via data line drivers.

Preferably, each programmable logic circuit includes an output device which is capable of receiving outputs from the match lines of the array and data bits output by the sense circuitry. The data which is supplied from the circuit by the output device from the programmable logic unit will depend on the setting of the mode select circuitry.

A programmable logic circuit of this type can be programmed to provide a programmable logic array function or a look-up table function according to the data stored in the array and the setting of the array according to the mode select circuitry.

The invention also provides an array of such programmable logic circuits, interconnected through an interconnection network which may be programmable. When connected in an array, each programmable logic circuit can include buffer circuitry on its inputs and outputs to enable it to cooperate with neighbouring circuits in the array.

For a better understanding of the present invention, and to show how the same may be carried into effect, reference will now be made by way of example to the accompanying drawings.

BRIEF DESCRIPTION OF THE DRAWINGS

FIG. 9 shows the main components of each logic function cell in the array of FIG. 8.

DESCRIPTION OF THE PREFERRED EMBODIMENT

Figure 1:
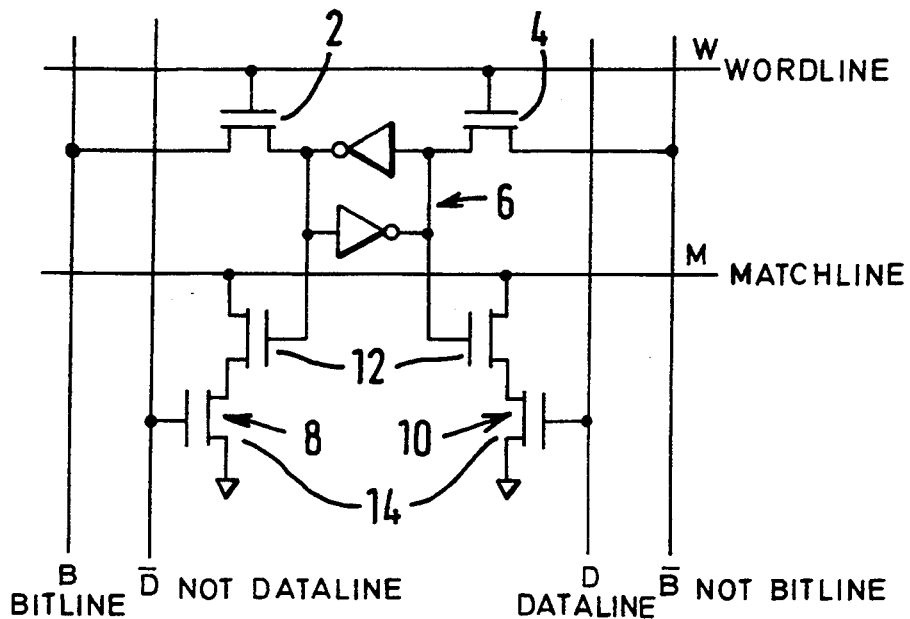
FIG. 1 illustrates one embodiment of a content addressable memory cell for use in the present invention.

Referring firstly to FIG. 1, a content addressable memory cell comprises first and second access transistors 2,4 each having their gates connected to a word line W, their sources connected respectively to bit line B and its inverse bit line B and their drains connected into a latch 6. The CAM cell also has first and second pairs 8,10 of associate transistors. Each pair of associate transistors is connected as follows. A first transistor 12 of each pair has its gate connected to the latch 6, its source connected to a match line M of the cell and its drain connected to the source of a second transistor 14 of the pair. The second transistors 14 have their gates connected respectively to data line D and its inverse D and their drains connected to ground.

Figure 2:
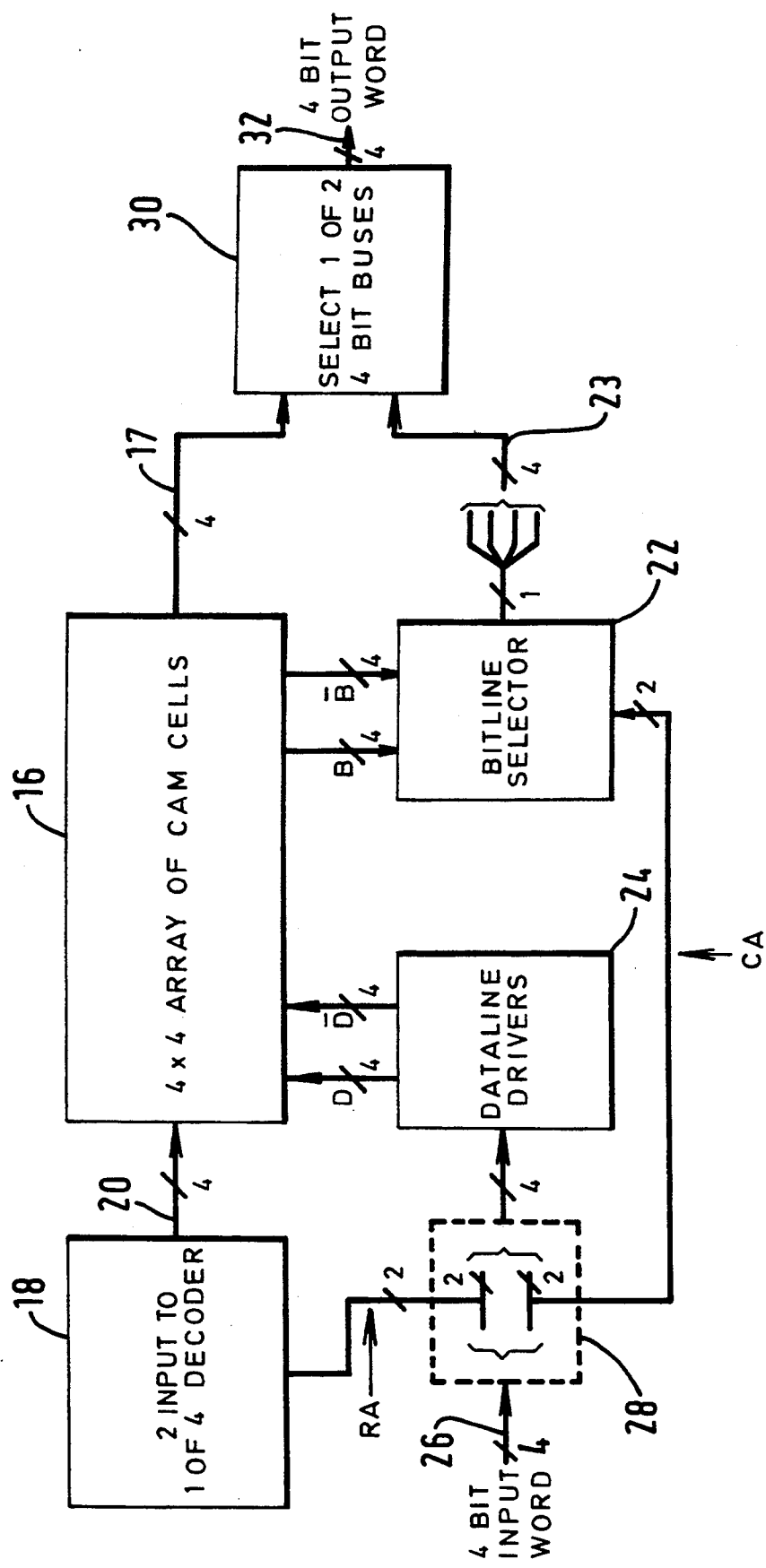
FIG. 2 is a block diagram illustrating one embodiment of a programmable logic circuit.

The cell can be used in two ways. In a RAM mode, when address circuitry takes the word line W high, a data bit stored in the cell will appear across bit lines B,B and can be sensed by conventional sense circuitry. In a CAM mode, if a data bit is placed on the data lines D,D, the match line will go low if the data bit does not match the data bit stored in the cell. In FIG. 2, reference numeral 16 denotes an array of such CAM cells. In the particular embodiment described herein, it is a 4×4 array. RAM access circuitry associated with the array comprises a decoder 18 which has four output lines 20 connected respectively to the word lines W of the array. The RAM access circuitry also includes sense circuitry 22 which is connected to each of the four bit lines B and their inverses B and which comprises a bit line selector for selecting which column of cells is to be sensed, in a manner which is well known per se. When the array is used in the RAM mode of operation, the single bit output from the sense circuitry is fed to each of four lines of a four bit bus to provide a four bit bus output 23.

CAM access circuitry 24 comprises data line drivers for driving data onto the data lines D and their inverses D for use in an associative operation. When the CAM access circuitry is in use, the outputs from the array appear on the match lines M and are supplied to a four bit bus 17.

An input routing circuit 28 receives a four bit input word 26 and can determine the mode of operation of the array by either routing the four bit input word directly to the data line drivers 24, or by splitting it into effectively a row address RA fed to the decoder 18 and the column address CA fed to the bit line selector 22. An output circuit 30 can select between the four bit bus 17 receiving four outputs from the match lines and the four bit bus 23 receiving the outputs from the sense circuitry. In either event, a four bit output word 32 is produced from the circuit.

The programmable logic circuit illustrated in FIG. 2 can be programmed by a user so that it operates either in a first (RAM) or a second (CAM) mode. In the first mode, a look-up table operation can be achieved using a conventional read cycle on the array. In this mode, a four bit input word is used to address a memory location in the array, wherein there is stored data representing the logic result of a particular function operating on the four bits of the input word, in conventional look-up table fashion. In the second mode of operation, a programmable logic array function can be achieved using the associative operation of the CAM. In this mode, each row of the array acts as a line of a programmable logic array having four inputs. Thus, the array can implement any function of four inputs in a look-up table mode or provide four programmable logic array lines each with four inputs.

Figure 3:
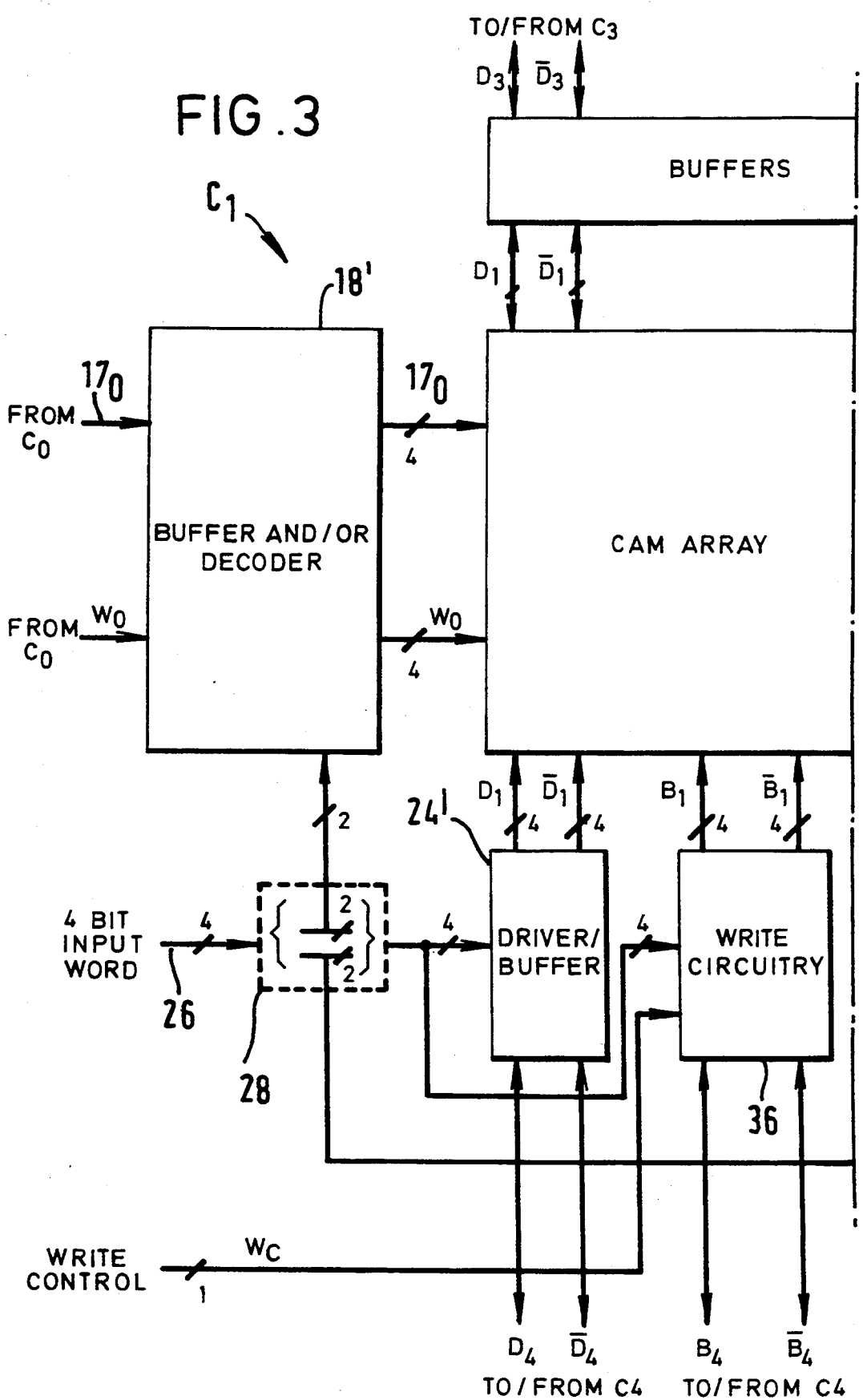
FIG. 3 is a block diagram illustrating an improved embodiment of a programmable logic circuit.

FIG. 3 illustrates an enhanced version of the programmable logic circuit of FIG. 2, which enables logic circuits to be utilised together in a manner which increases the number of available inputs and outputs. Thus the block 18' denotes buffer and decode circuitry which not only provides a decoder associated with the array but can also implement three buffer functions. In the first buffer function the four match outputs $17_o$ from the previous adjacent circuit $C_o$ can be buffered to connect with the respective match lines $M_1$ of the array $16_1$ of the circuit $C_1$. In this manner arrays of adjacent circuits can be coupled to handle larger word sizes in the CAM mode. In the second buffer function the four word lines $W_o$ from the previous adjacent circuit $C_o$ can be buffered to connect with the respective word lines $W_1$ of the array $16_1$.

The ability of the programmable logic circuit of FIG. 3 to connect the word lines of adjacent circuits to behave as a single word line enables large memory arrays to be constructed. Also, the word lines of the circuit $C_0$ could be used in some instances to address the array $16_1$ of the circuit $C_1$ by taking a particular word line high and allowing data to be sensed by the bit line selector 22. In the third buffer function, the match output $17_0$ of the circuit $C_0$ can be connected to the word lines $W_1$ of the array $16_1$, allowing the memory array $16_1$ to be addressed by the match outputs $17_0$ of the previous adjacent circuit $C_0$. In this manner, adjacent arrays can again be coupled to create larger memory arrays, with some circuits used to store the data and others to perform the addressing.

A similar buffering capability can be provided in addition to the output circuit 30 as illustrated by output buffer circuit 31. In this manner the word lines $W_1$ of the array $16_1$, can be connected either to the word lines $W_2$ or the match lines $M_2$ of the adjacent following circuit $C_2$, or the match outputs $17_1$ of the array $16_1$ can be connected to the match lines $M_2$ of the adjacent following circuit $C_2$. It can be seen that this buffering technique allows the arrays of any number of adjacent circuits to be coupled together to handle much larger word sizes than would be possible with a single array. It also allows the array of one circuit to be addressed by or to address a neighbouring circuit.

An additional buffer circuit 34 is connected to the data lines $D_1$, $\overline{D}_1$ and the bit lines $B_1$, $\overline{B}_1$ to allow an upper adjacent circuit $C_3$ to have its data lines $D_3$, $\overline{D}_3$ connected to the data lines $D_1$, $\overline{D}_1$ of the circuit $C_1$ and its bit lines $B_3$, $\overline{B}_3$ connected to the bit lines $B_1$, $\overline{B}_1$ of the circuit $C_1$. The buffer circuit 34 can alternatively connect the data lines $D_3$, $\overline{D}_3$ to the bit lines $B_1$, $\overline{B}_1$ to provide an alternative write path.

The data line driver 24 of the circuit of FIG. 2 is replaced by a driver/buffer circuit 24' which can be used not only to drive the data lines of that circuit $C_1$ but can also implement two other functions: firstly, it can additionally drive the data lines $D_4$, $\overline{D}_4$ of the next below circuit $C_4$; and secondly it can act as a buffer to connect the data lines $D_4$, $\overline{D}_4$ to the data lines $D_2$, $\overline{D}_2$ of the circuit $C_1$. In this way, the circuits can be used in combination to increase the number of available inputs and outputs.

The array 16 can be written to by the provision of write circuitry 36 in each programmable logic circuit connected to the bit lines $B_1, \overline{B}_1$ and controllable in response to a write control signal WC. The write circuitry 36 is also connected to the bit lines $B_4, \overline{B}_4$ of the lower adjacent circuit $C_4$ so that it can simultaneously write to the array $16_4$ of that circuit. The write circuitry is also able to implement a buffer function to connect the bit lines $B_4, \overline{B}_4$ of the lower adjacent circuit to the bit lines $B_1, \overline{B}_1$ of the circuit $C_1$. The data to be written is supplied as a four bit input word 26. The array can be addressed for writing by the match lines or word lines of the array of a previous adjacent circuit through the decode and buffer circuitry 18' as described above. The input routing circuit 28 thus has an additional function in the circuit of FIG. 3 to determine the routing of the input word 26 for writing.

Figure 4:
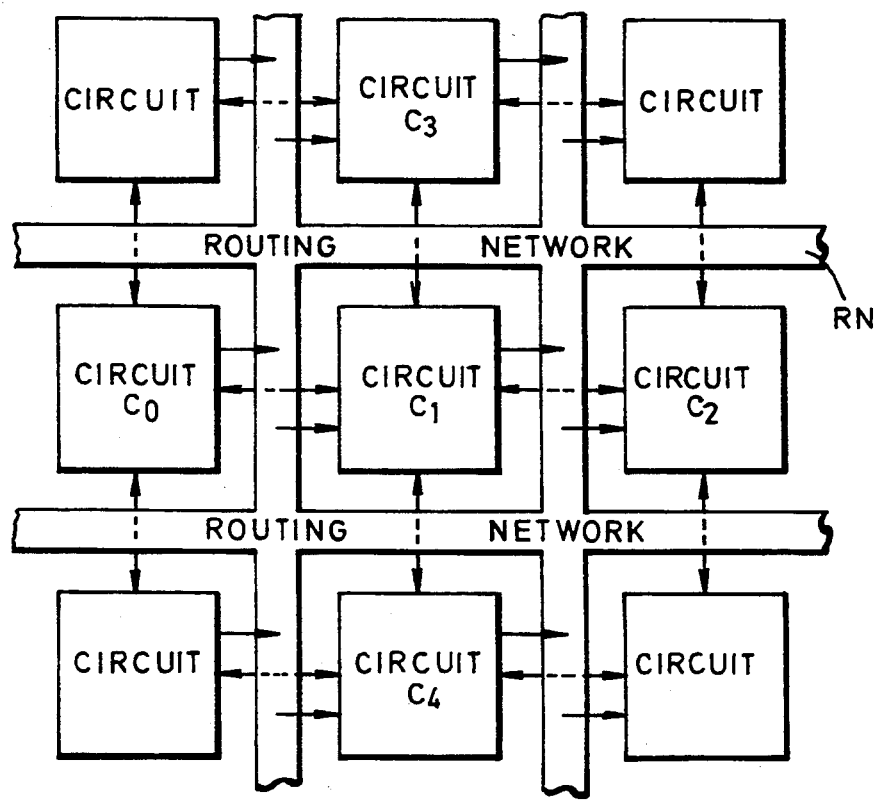
FIG. 4 is a block diagram showing part of an array of programmable logic circuits.

FIG. 4 illustrates an array of circuits connected via a routing network which can be fixed or programmable. In the array of FIG. 4, a first column of circuits can be used in the CAM mode, with their match line outputs connected to the word lines of a neighbouring column of circuits. These circuits are set up with their bit lines connected together so that the output data can be read using the output lines of just one of the circuits in that column, regardless of which circuit it is actually stored in.

To illustrate the benefits of the present invention, consider two common logic devices.

i) A four-input to 1-of-16 outputs decoder. Using a conventional programmable logic array, such a decoder would require each row to consist of four line switches. Thus, if implemented in a programmable logic array architecture, the whole decoder would take 16 rows or a total of 64 switches.

With a look-up table architecture, each decoder output requires a four input look-up table, that is a 4×4 memory array where two bits are used to address the rows of the memory and two bits are used to address the columns. Thus, 256 memory cells are required in total.

ii) A four input exclusive OR gate. This provides for each set of four inputs a single logic bit output, and can thus be implemented in look-up table architecture as a 4×4 array of memory cells, and thus uses 16 memory cells. Its Boolean equivalent can be written as eight AND functions each of four bits, which are then required to be ORed together. Implemented in a programmable logic array architecture, each of the eight AND functions would require its own four input PAL line, and the OR function requires an eight input line to combine these intermediate results. Thus, implemented as a PLA the gate would require 40 PLA switches.

Figure 5A:
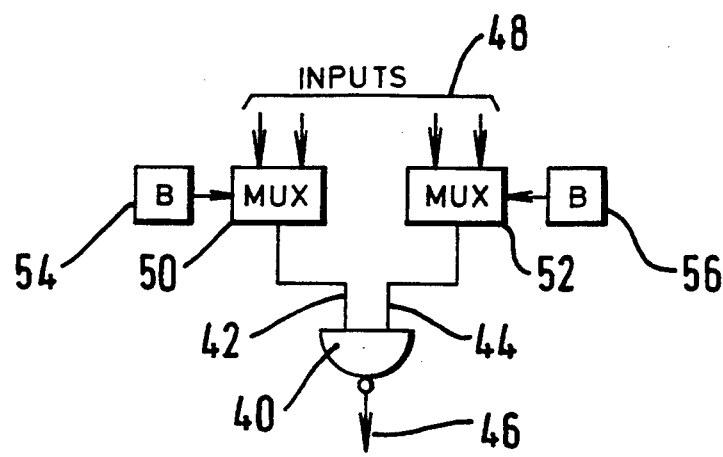
FIGS. 5a and 5b denote a basic unit for a programmable logic circuit according to another embodiment of the present invention.

The programmable logic circuit according to the present invention enables both of these functions to be implemented in the most efficient fashion. That is, the decoder can be implemented using the array of each circuit as a CAM array and by using four circuits stacked together. The exclusive OR gate can be implemented using a single circuit implemented as a RAM. FIG. 5a is a circuit diagram showing a basic unit for constructing a programmable logic circuit in accordance with another embodiment of the present invention. The basic unit comprises a NAND gate 40 having two inputs 42,44 and an output 46. A set of inputs 48 is supplied to the basic unit, the inputs being fed to multiplexers 50,52 associated respectively with each input 42,44 of the NAND gate 40. In the unit illustrated in FIG. 5a two inputs are fed to each multiplexer. Each multiplexer can be programmed to determine which of the two inputs fed to it are routed to the NAND gate 40, under the control of a programming bit designated 54 for multiplexer 50 and 56 for multiplexer 52. This basic unit is already known and is currently used to implement fixed gate arrays having a plurality of these units with their interconnections controlled by programming of the multiplexers.

Figure 5B:
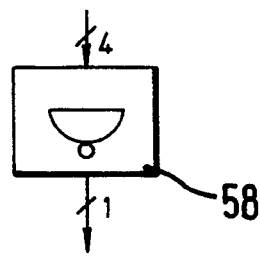

FIG. 5b denotes how the basic unit of FIG. 5a will be illustrated in the following drawings, designated by reference numeral 58.

Figure 6:
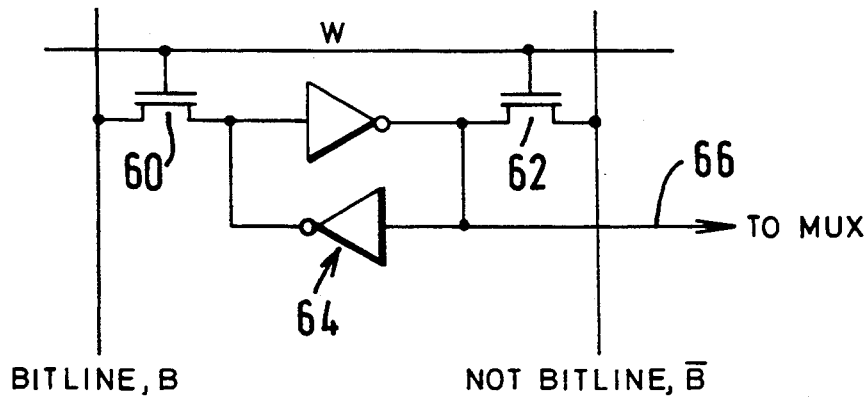
FIG. 6 shows a data bit storage cell for the embodiment of FIGS. 5a and 5b.

FIG. 6 illustrates an implementation of a data bit storage cell for storage of the programming bits 54,56 which enables a programmable logic circuit in accordance with a second embodiment of the present invention to be constructed. Thus, instead of storing the programming bits 54,56 in a separate block of memory as is normally the case for a fixed gate array, each programming bit is stored in a circuit of the type illustrated in FIG. 6. In that circuit, two access transistors 60,62 have their drains connected respectively to a bit line B and its inverse B and their sources connected into a common latch 64. The gates of the access transistors 60,62 are connected to a word line W. The output of the latch 66 is connected to the multiplexer.

The circuit illustrated in FIG. 6 can, as an alternative to holding a data bit for controlling the state of the multiplexer, hold a data bit in a memory location of an addressable memory array. In this case, a plurality of the data bit storage circuits can be arranged to be commonly addressed to enable a look-up table to be implemented. As illustrated in FIG. 5a, each basic unit has two data bits associated with it. Therefore, to implement a look-up table having 16 bits, eight basic units are required.

Figure 7:
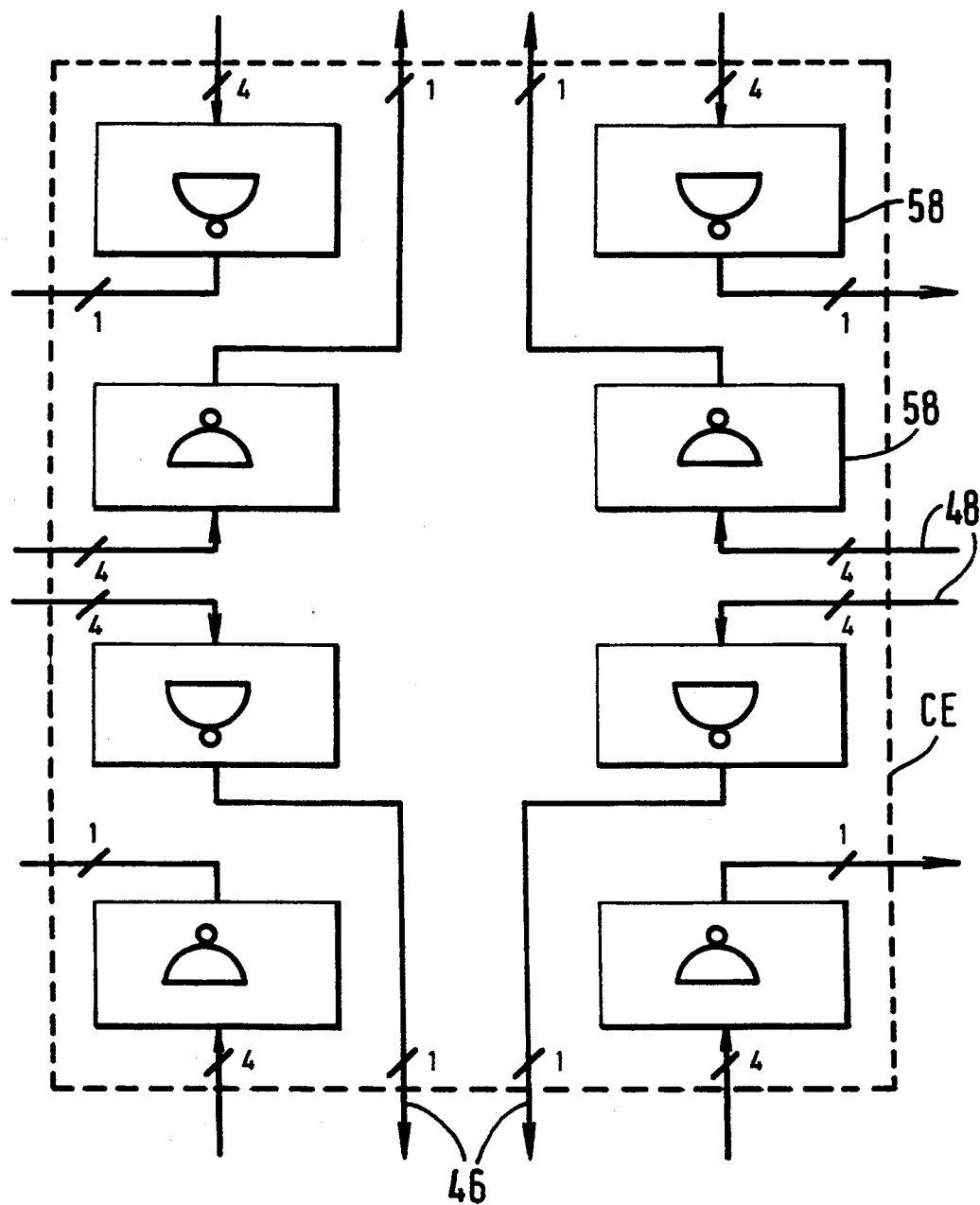
FIG. 7 shows an arrangement of basic units.

FIG. 7 is a diagram showing how eight basic units 58 might be arranged to provide a basic logic function cell CE capable of performing either a fixed gate logic function or a look-up table function. The arrangement is such that each side of the cell provides two outputs and two sets of inputs. This makes the cell CE suitable for connection in an array of cells.

Figure 8:
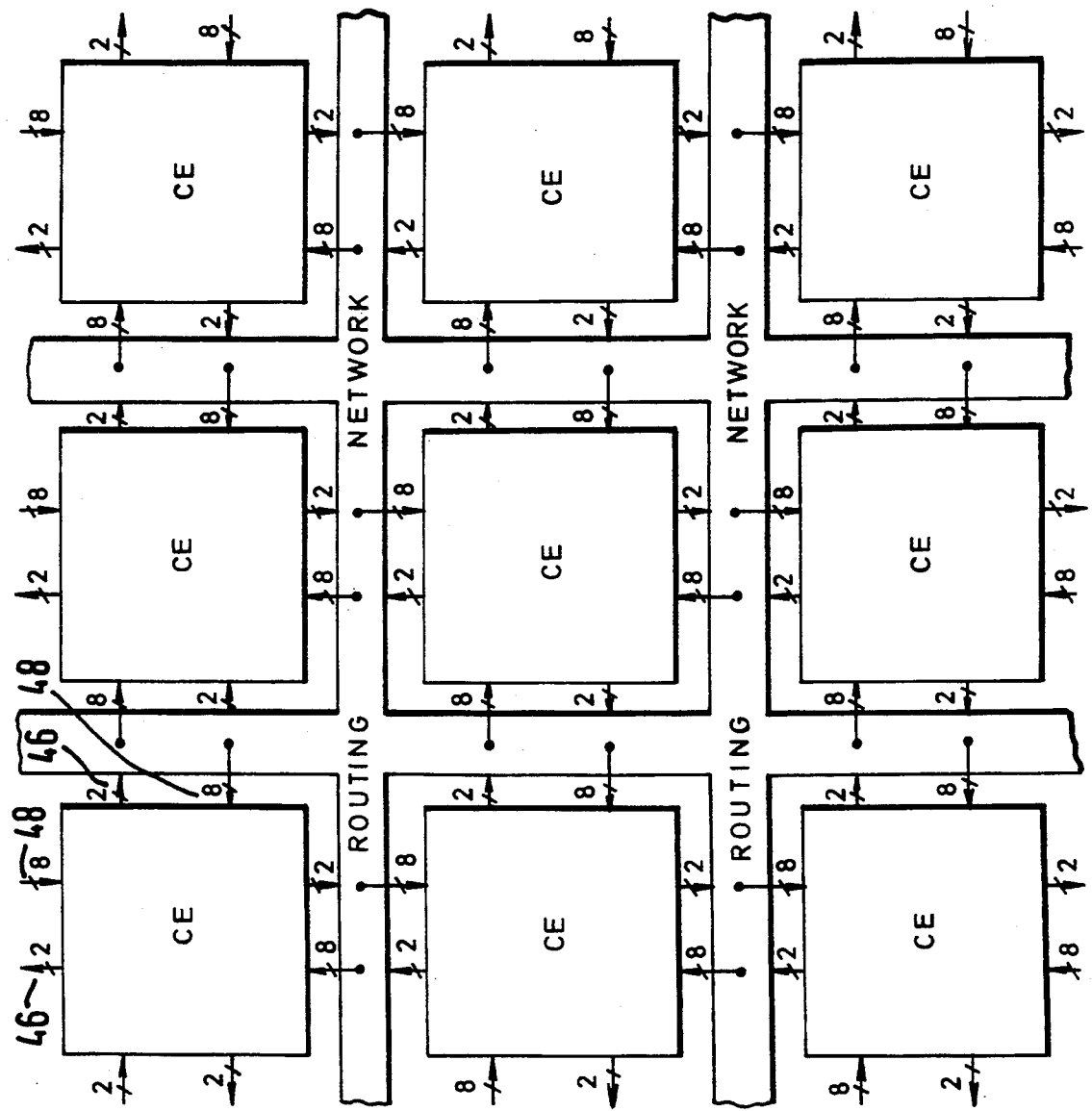
FIG. 8 shows an array of logic function cells.

FIG. 8 illustrates part of such an array. Each set of inputs and outputs 46,48 is connected into a routing network RN which determines how the cells CE are interconnected. The routing network can comprise a plurality of fixed wires which permanently connect certain inputs of the cells CE to certain outputs of other cells CE, or it can be a programmable routing network where these interconnections can be changed.

Each cell CE includes not only the basic units 58 described above but also memory address circuitry enabling the cells CE to be addressed in a common block to operate as a look-up table. FIG. 9 illustrates this memory address circuitry. The arrangement of basic units 58 illustrated in FIG. 7 places four data bit storage cells side by side in a row, there being four such rows arranged below one another to define four columns. This arrangement is addressable as a memory array. The memory address circuitry comprises a row decoder 70 having four outputs connected respectively to each of the four word lines for the data bit storage circuits and a column decoder 72 connected to the bit lines B,B of each of the four columns of the data bit storage cells. An input select circuit 74 is connected to the routing network RN and receives inputs 90 therefrom. The select circuit selects an appropriate combination of its inputs from the routing network for addressing the data bit storage cells. Thus, two bits are applied as a row address RA to the row decoder 70 and two bits are applied as a column address CA to the column decoder 72. Mode control buffers 78,80,82 determine whether or not the cell CE operates to perform a fixed gate logic function or as a look-up table. When the cell CE is to operate as a look-up table, buffers 78,80 connected to the outputs 46 of the NAND gates inhibit further passage of these outputs to the routing network. When the cell CE is to operate to perform a fixed gate logic function, the buffer 82 which is connected to receive an output signal from the column decoder 72 inhibits further passage of this output signal to the routing network. These buffer circuits 78,80 and 82 thus enable the mode of operation of the cell CE to be selected. When the cell CE is to operate to perform a fixed gate logic function, the inputs 48 to the gates 40 are taken directly from the routing network.

What is claimed is:

1. A programmable logic device comprising a plurality of logic circuits interconnected through an interconnection network, each logic circuit comprising: an array of memory cells, each memory cell being
    (a) responsive to an address signal at the location of that cell to output data stored in the cell, and
    (b) operable to compare data input to it with data stored in it and to output a match signal when said input data matches said stored data;
    first circuitry for operating said array as a random access memory (RAM) with the cells in mode a);
    second circuitry for operating said array as a content addressable memory (CAM) with the cells in mode b); and
    a mode select circuit operable to selectively control operation of the cell as CAM or RAM, the logic device further comprising programming circuitry arranged to control the state of the mode select circuits.

2. A programmable logic circuit as claimed in claim 1, wherein the mode select circuit is arranged to route a sequence of data bits input to the cell selectively to one of said first and second circuits.

3. A programmable logic circuit as claimed in claim 1, wherein the array has a first output for providing output data when it is operating in mode (a) and a second output for providing output data when it is operating in mode (b) and wherein the mode select circuit is arranged to select a particular one of said first and second outputs.

4. A programmable logic circuit according to claim 1, wherein the array of memory cells comprises:
    a plurality of word lines, each word line being connected to a plurality of cells arranged in a row;
    a plurality of match lines, each match line being arranged to be driven by said plurality of cells in the row;
    a plurality of data lines, each data line being connected to a plurality of cells arranged in a column; and
    a plurality of sets of bit lines, each set being connected to a plurality of cells arranged in a column.

5. A programmable logic circuit according to claim 4, wherein the first circuitry comprises address circuitry for addressing a particular word line of the array and sense circuitry for sensing the data on a particular bit line of the array.

6. A programmable logic circuit according to claim 1 which includes buffer circuitry connected to inputs and/or outputs of the circuit to enable it to cooperate with neighbouring circuits to form a logic array.

* * * * *